United States Patent
Beitel et al.

(10) Patent No.: US 7,078,309 B2
(45) Date of Patent: Jul. 18, 2006

(54) METHODS FOR PRODUCING A STRUCTURED METAL LAYER

(75) Inventors: Gerhard Beitel, Munich (DE); Annette Sänger, Dresden (DE); Walter Hartner, Munich (DE)

(73) Assignee: Infineon Technologies AG, Munich (DE)

( * ) Notice: Subject to any disclaimer, the term of this patent is extended or adjusted under 35 U.S.C. 154(b) by 883 days.

(21) Appl. No.: 09/734,467

(22) Filed: Dec. 11, 2000

(65) Prior Publication Data
US 2002/0008265 A1    Jan. 24, 2002

(30) Foreign Application Priority Data
Dec. 10, 1999    (DE) ................................ 199 59 711

(51) Int. Cl.
*H01L 21/20* (2006.01)
(52) U.S. Cl. ...................... 438/396; 438/658; 438/660
(58) Field of Classification Search ................ 438/396, 438/656, 658, 660, 663, 685, 686
See application file for complete search history.

(56) References Cited

U.S. PATENT DOCUMENTS

| 5,142,437 A | 8/1992 | Kammerdiner et al. |
| 5,348,894 A | 9/1994 | Gnade et al. |
| 5,374,578 A | 12/1994 | Patel et al. |
| 5,471,364 A | 11/1995 | Summerfelt et al. |
| 5,500,559 A * | 3/1996 | Miyata et al. ............... 257/762 |
| 5,504,041 A | 4/1996 | Summerfelt |
| 5,555,486 A | 9/1996 | Kingon et al. |
| 5,708,302 A | 1/1998 | Azuma et al. |
| 5,714,402 A | 2/1998 | Choi |
| 5,723,171 A | 3/1998 | Cuchiaro et al. |
| 5,789,268 A | 8/1998 | Chivukula et al. |
| 5,952,687 A * | 9/1999 | Kawakubo et al. ......... 257/296 |
| 5,976,928 A * | 11/1999 | Kirlin et al. ................. 438/240 |
| 6,022,808 A * | 2/2000 | Nogami et al. .............. 438/694 |
| 6,376,355 B1 * | 4/2002 | Yoon et al. .................. 438/618 |
| 6,395,194 B1 * | 5/2002 | Russell et al. ............. 252/79.1 |
| 6,495,874 B1 * | 12/2002 | Kawamura et al. ......... 257/301 |

FOREIGN PATENT DOCUMENTS

| DE | 199 04 781 A1 | 8/1999 |
| JP | 11 121 411 | 4/1999 |

\* cited by examiner

*Primary Examiner*—Kevin M. Picardat
(74) *Attorney, Agent, or Firm*—Laurence A. Greenberg; Werner H. Greenberg; Ralph E. Locher

(57) ABSTRACT

The invention provides methods which can be used to structure even precious metal electrodes with conventional CMP steps, in particular with the aid of conventional slurries such as are already used to structure non-precious metals. Owing to the formation of an alloy, the chemically active components of the slurry are capable of attacking the additive to the precious metal in the alloy, as a result of which the surface of the alloy layer is roughened and the mechanical removal of the precious metal is increased.

18 Claims, 9 Drawing Sheets

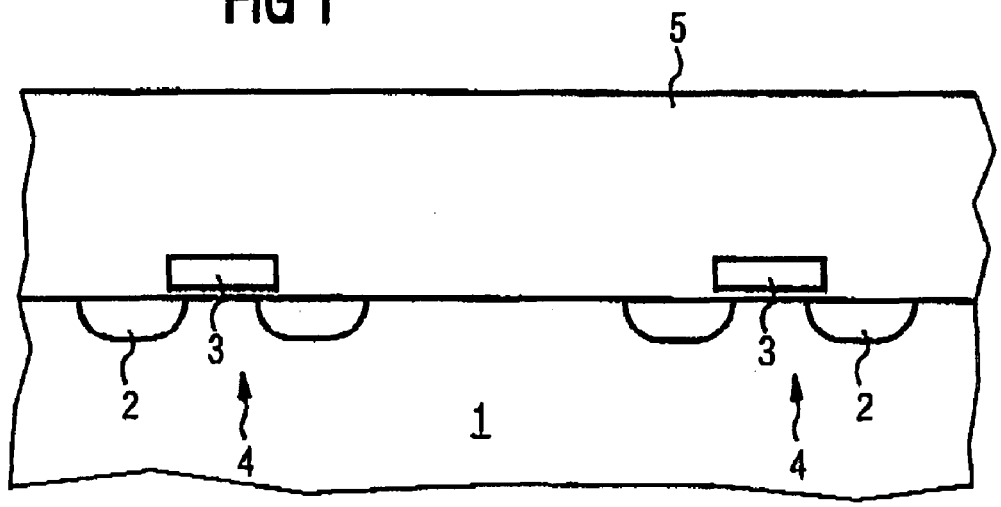
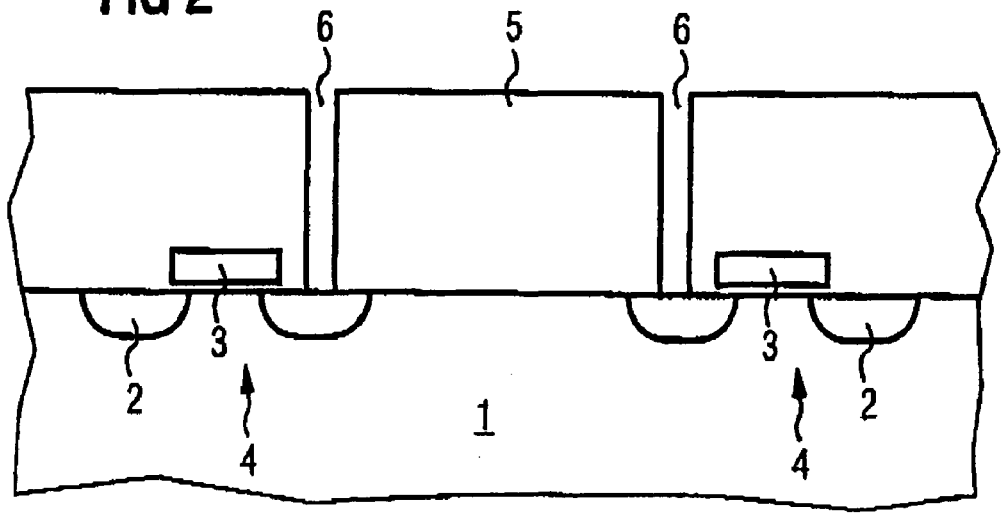

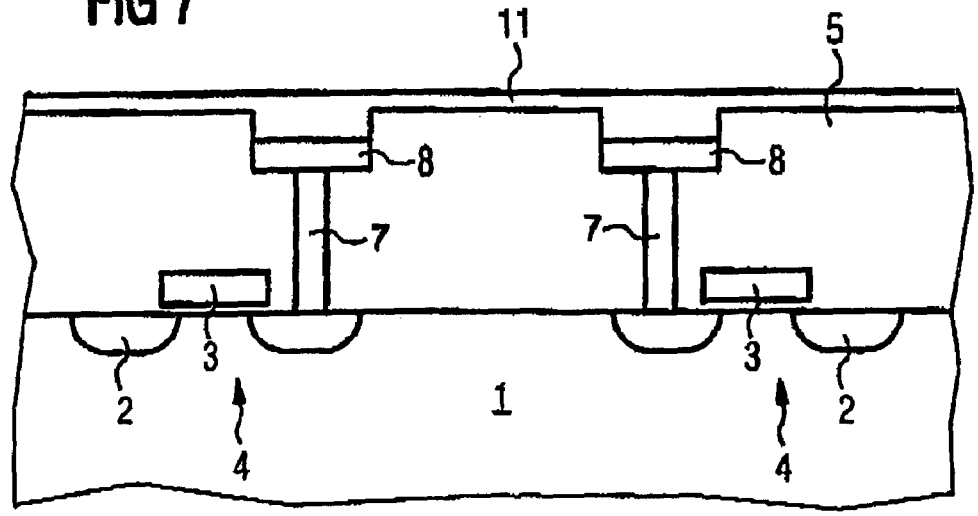
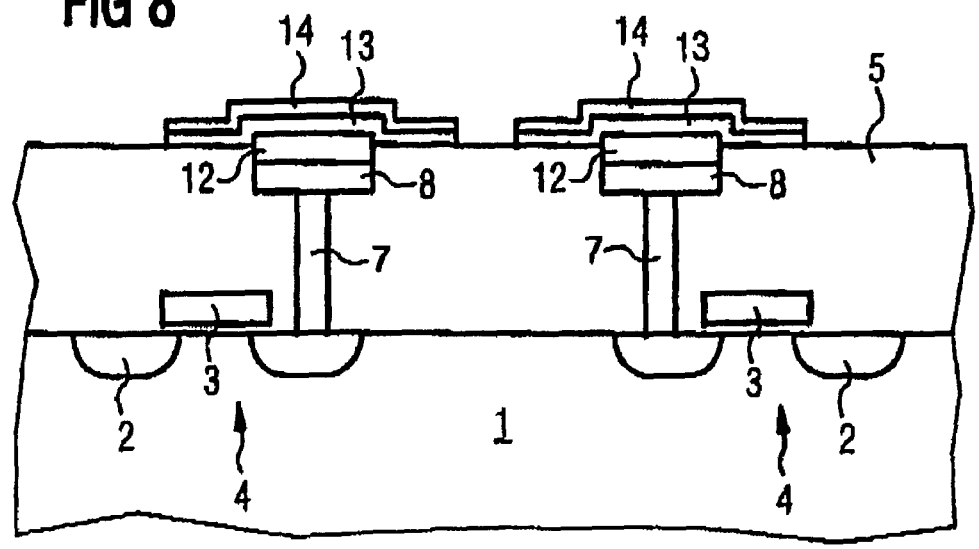

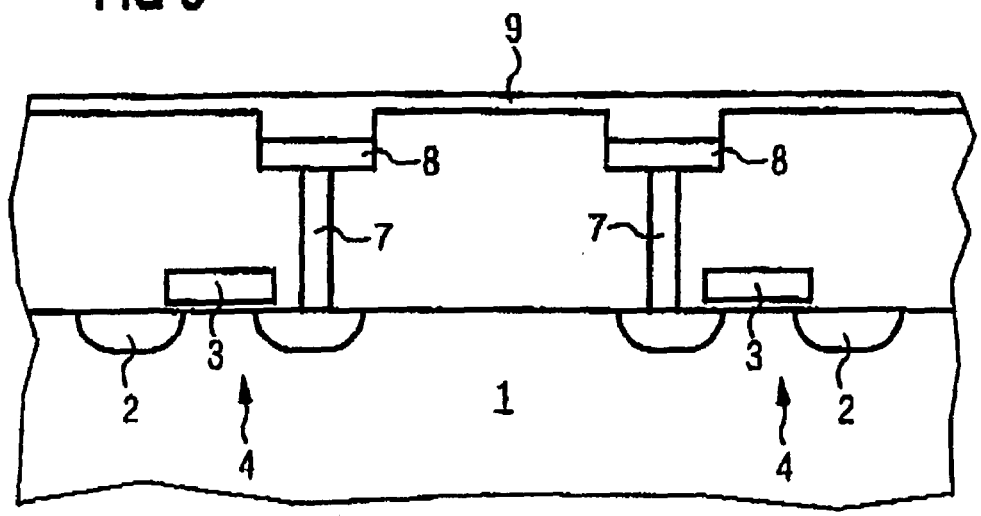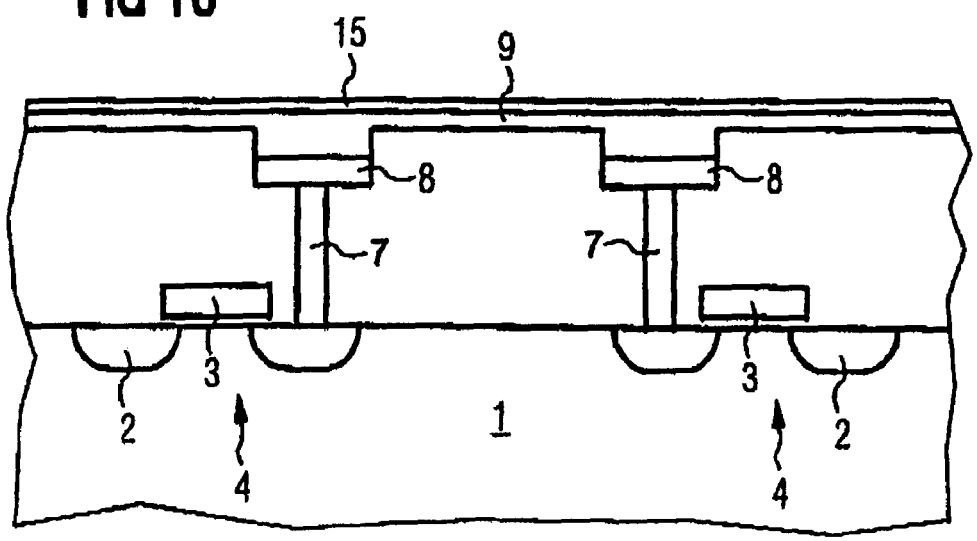

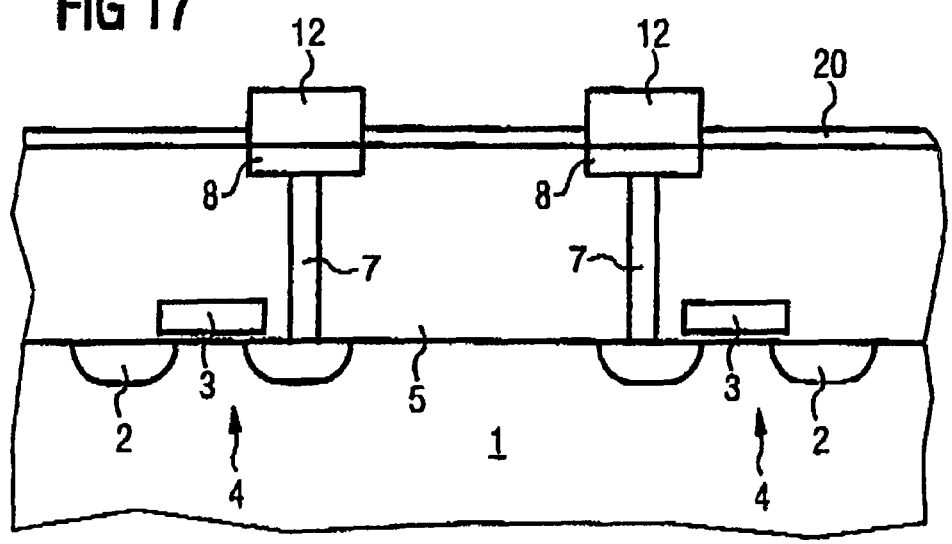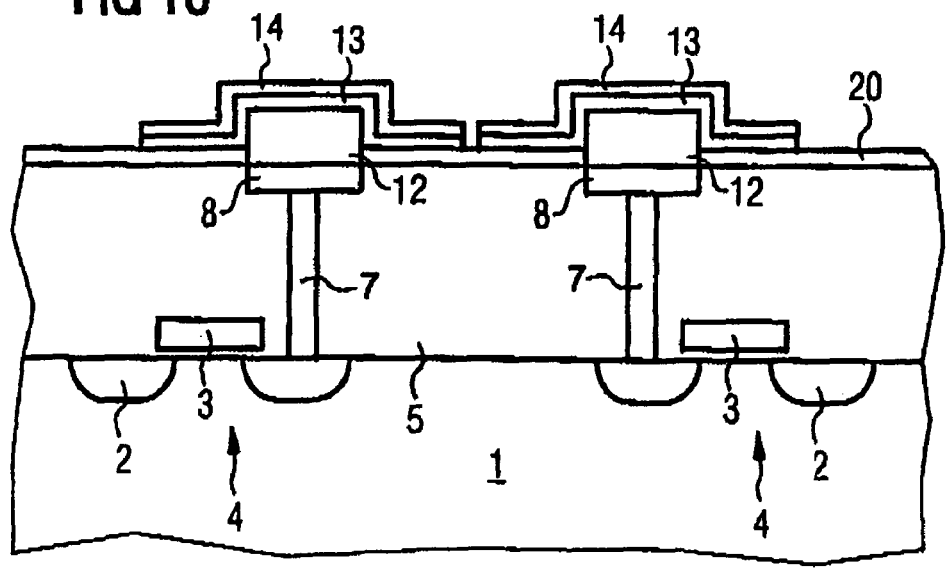

METHODS FOR PRODUCING A STRUCTURED METAL LAYER

BACKGROUND OF THE INVENTION

Field of the Invention

The invention relates to methods for producing a structured metal layer, in particular a method for producing an electrode and, in particular, a method for producing an electrode for a storage capacitor of an integrated memory device.

In order to be able to read out reproducibly the charge stored in a storage capacitor of a memory cell, the capacitance of the storage capacitor should have a value of at least approximately 30 fF. At the same time, it has been and is necessary continuously to reduce the lateral extent of the capacitor in order to be able to achieve an increase in the storage density. These inherently contradictory requirements placed on the capacitor of the memory cell have led and lead to an ever more complex structuring of the capacitor (trench capacitors, stack capacitors, crown-shaped capacitors), in order to be able to provide sufficient capacitor area despite the ever smaller lateral extent of the capacitor. Consequently, however, the production of the capacitor is becoming ever more complicated, and therefore ever more expensive.

A further way of ensuring sufficient capacitance of the capacitor is to use other materials between the capacitor electrodes. Consequently, instead of the conventional silicon oxide/silicon nitride, use has been made recently of newer materials, in particular high-$\in$ paraelectrics and ferroelectrics, between the capacitor electrodes of a memory cell. These novel materials have a substantially higher relative dielectric constant (>20) than the conventional silicon oxide/silicon nitride (<8). Consequently, the required capacitor area, and thus the required complexity of the structuring of the capacitor, can be substantially reduced in conjunction with the same capacitance and the same lateral extent of the memory cell by using these materials. Use is made, for example, of barium strontium titanate (BST, $(Ba,Sr)TiO_3$), lead zirconate titanate (PZT, $Pb(Zr,Ti)O_3$) and lanthanum-doped lead zirconate titanate or strontium bismuth tantalate (SBT, $SrBi_2Ta_2O_9$).

In addition to conventional DRAM memory chips, an important role will also be played in the future by ferroelectric memory devices, so-called FRAMs. By contrast with conventional memory devices, such as DRAMs and SRAMs, for example, ferroelectric memory devices have the advantage that the stored information is not lost, but remains stored even in the event of an interruption to the voltage or current supply. This non-volatility of ferroelectric memory devices is based on the fact that in the case of ferroelectric materials the polarization impressed by an external electric field is essentially maintained even after the external electric field is switched off. The abovenamed novel materials such as lead zirconate titanate (PZT, $Pb(Zr,Ti)O_3$) and lanthanum-doped lead zirconate titanate or strontium bismuth tantalate (SBT, $SrBi_2Ta_2O_9$) also come into use for ferroelectric memory devices.

Unfortunately, the use of the newer paraelectrics or ferroelectrics also requires the use of novel electrode materials. The newer paraelectrics or ferroelectrics are usually deposited on already present electrodes (lower electrode). The processing is performed at high temperatures, where the materials of which the capacitor electrodes normally consist, for example doped polysilicon, are easily oxidized and lose their electrically conducting properties, something which would lead to failure of the memory cell.

Because of their good oxidation resistance and/or the formation of electrically conductive oxides, 4d and 5d transition metals, in particular precious metals such as Ru, Rh, Pd, Os, Ir and, in particular, Pt count as promising candidates which could replace doped silicon/polysilicon as electrode material.

Unfortunately it has been found that the abovenamed electrode materials being newly used in integrated circuits can be structured only with difficulty. For example, these materials can be etched chemically only with difficulty, or even not at all, so that the etching erosion is based, even when "reactive" gases are used, predominantly or almost exclusively on the physical component of the etching. Moreover, these materials prove to be extremely resistant even in the case of the use of so-called CMP (chemical mechanical polishing) methods.

In conventional polishing methods, a polishing solution, a so-called slurry which contains abrasive particles, is applied to the substrate to be polished. During the actual polishing operation, a so-called pad is then pressed against the surface of the substrate, and pad and substrate are moved relative to one another. The pressure exerted by the pad then presses the abrasive particles against the surface of the substrate, and the relative movement of pad and substrate removes material from the surface of the substrate. As a rule, the rate of such removal depends on the pressure exerted, the relative speed and the selected abrasive particles. In order to increase the rate of removal and/or to remove only very specific materials from the surface, it is possible to add to the slurry chemical components which react with the material of the substrate surface and/or with a specific material on the surface. Thus, for example, when wiring areas are being produced, components which react with the aluminum on the surface are added to the slurry. Such a CMP step results in an aluminum wiring in which aluminum structures form a flat surface with the insulating structures. Aluminum conductor tracks can thus be produced in a simple and cost effective way (damascene technology).

Because of the inertness of the novel electrode materials, the mechanical component of a CMP step, that is to say the mechanical action of the abrasive particles, is very important for the purpose of removing the materials from a substrate surface. Consequently, these materials can be removed from the substrate surface only at a very low rate of removal. Moreover, there is increased risk of the formation of scratches which can render a chip unusable. Experiments with very aggressive chemical components in the slurry have not, on the other hand, led to the desired results.

SUMMARY OF THE INVENTION

It is accordingly an object of the invention to provide a method for producing a structured metal layer that overcomes the above-mentioned disadvantages of the prior art devices and methods of this general type, which permits metal electrodes including even precious metal electrodes to be structured.

With the foregoing and other objects in view there is provided, in accordance with the invention, a method for producing a structured layer comprising the steps:

a) providing a prestructured substrate;

b) applying to the prestructured substrate a precious metal and a donor material containing an additive which is not a precious metal in two or more layers;

c) subjecting the layers to heat treatment at a temperature of between approximately 400° C. and approximately 800° C., such that the additive diffuses into the precious metal and an alloy layer is produced; and d) polishing the alloy layer by chemical and mechanical means.

The structured layers so produced are preferably used as electrodes in memory cells and other advantageous embodiments and refinements as shown below and in the attached drawings.

In accordance with another feature of the invention there is provided a method for producing a structured layer comprising the steps:

a) providing a prestructured substrate;

b) simultaneously applying to the prestructured substrate a precious metal and an additive which is not a precious metal using a PVD method, such that an alloy layer is produced; and c) polishing the alloy layer by chemical and mechanical means.

The methods according to the invention have the advantage that even precious metal electrodes can be structured by means of conventional CMP steps, in particular with the aid of conventional slurries, such as are already used for structuring non-precious metals. Without wishing to limit themselves the inventors are of the opinion that this can be explained by the fact that the chemically active components of the slurry attack the additive to the precious metal in the alloy, as a result of which the surface of the alloy layer is roughened and the chemical mechanical removal of the precious metal is thereby increased. However, the good electric conductivity and the inertness, in particular with regard to gas phase CVD processes with subsequent heat treatments, of the original precious metal layer are essentially maintained in the case of the alloy layer thus formed. Thus, according to the invention, there is created an electrode which has a very good electrical conductivity. Moreover, in the case of gas phase CVD depositions and subsequent heat treatments (annealing processes), the electrode is inert to the greatest possible extent. The behavior of the electrodes in the case of wet-chemical polishing and structuring operations is, however, changed by the modification according to the invention in such a way that the electrodes can be treated with conventional slurries.

The donor material can preferably comprise essentially only the additive. Thus, for example, it is possible to produce a pure titanium layer on a platinum layer. The subsequent heat treatment diffuses titanium into the platinum, thus producing a platinum/titanium alloy. However, it is also possible to use a titanium oxide layer ($TiO_x$) as donor material. The subsequent heat treatment diffuses only the titanium into the platinum, such that, on the one hand, a platinum/titanium alloy is produced, while on the other hand a titanium oxide layer with a different stoichiometric composition is left behind on the alloy layer. This titanium oxide layer is removed from the alloy layer by an additional etching step, for example with HF or HCL.

Preferred precious metals which are used in conjunction with the present invention are the precious metals from the transition Group 8b of the Periodic Table of the Elements, and gold (Au). Osmium (Os), iridium (Ir) and platinum (Pt) belong to Group 8b, Ir and Pt being particularly preferred.

The additive, which is not a precious metal, can preferably be selected from Ti, Ta, W, Bi, Ru and/or Pd and oxides thereof.

The donor material, which contains the additive, can preferably be selected from Ti, TiN, Ta, TaN, W, WN, Bi, $BiO_x$, $IrO_x$, $IrHfO_x$, $RuO_x$ and/or $PdO_x$.

It has proved to be particularly effective and easy to carry out the treatment when the proportion of non-precious metals in the alloy layer is between approximately 5 and approximately 30 at %.

In accordance with a preferred embodiment, the alloy layer is made up of several layers. Both the layer sequence of precious metal (EM)/donor material (X) and the reverse sequence X/EM are possible. Also suitable are multiples of the said layer sequences, for example, EM/X/EM/X, EM/X/EM/X/EM/X etc. and X/EM/X/EM, X/EM/X/EM/X/EM etc. Finally, the advantages according to the invention are also afforded by a sequence of an odd number of layers such as X/EM/X, X/EM/X/EM/X etc. and EM/X/EM/X/EM etc.

In accordance with a further preferred embodiment, a slurry which contains water, abrasive particles and at least one oxidant is used for the chemical mechanical polishing. It is preferred, in particular, when $Al_2O_3$ particles or $SiO_2$ particles are used as abrasive particles and/or $H_2O_2$ is used as oxidant. Furthermore, it is preferred when the slurry has at least one stabilizer, preferably polyacrylic acid.

Other features which are considered as characteristic for the invention are set forth in the appended claims.

Although the invention is illustrated and described herein as embodied in methods for producing a structured metal layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1–8 show a method for producing a structured layer according to a first exemplary embodiment of the invention, with reference to the production of a memory cell, FIGS. 9–12 show a further method for producing a structured layer according to a second exemplary embodiment of the invention, and FIGS. 13–18 show a method for producing a structured layer according to a third exemplary embodiment.

DESCRIPTION OF THE PREFERRED EMBODIMENTS

Figure 3:
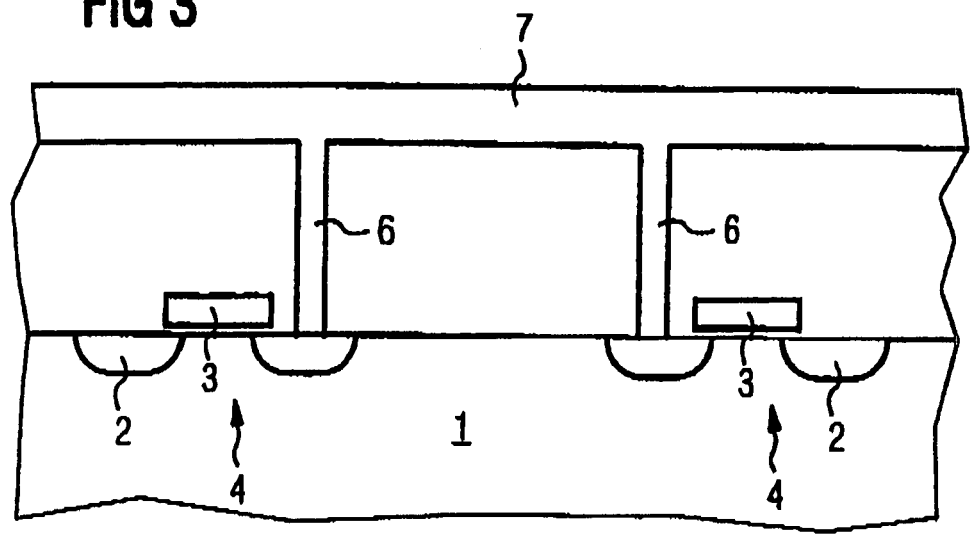

FIG. 1 shows a silicon substrate 1 with previously fabricated transistors 4. Together with the storage capacitors still to be produced, the transistors form memory cells which serve the purpose of storing binary information. The transistors 4 each have two diffusion zones 2, which are disposed on the surface of the silicon substrate 1. The channel zones, which are separated from the gate electrodes 3 by the gate oxide on the surface of the silicon substrate 1, are disposed between the diffusion zones 2 of the transistors 4. The transistors 4 are produced using the methods known in the prior art, which are not explained here in more detail.

An insulating layer 5, for example an $SiO_2$ layer, is applied to the silicon substrate 1 bearing the transistors 4. Several insulating layers can also be applied, depending on the method used for producing the transistors 4. The structure resulting therefrom is shown in FIG. 1.

The contact holes 6 are subsequently produced by a photographic technique. These contact holes 6 make a connection between the transistors 4 and the storage capacitors still to be produced. The contact holes 6 are produced, for example, by anisotropic etching with fluorine-containing gases. The resulting structure is shown in FIG. 2.

A conductive material 7, for example polysilicon doped in situ, is subsequently applied to the structure. This can be performed, for example, by a CVD method. The contact holes 6 are completely filled up by the application of the conductive material 7, and a continuous conductive layer is produced on the insulating layer 5 (FIG. 3). This is followed by a CMP step (Chemical Mechanical Polishing), which removes the continuous conductive layer on the surface of the insulating layer 5 and produces a flat surface.

Figure 4:
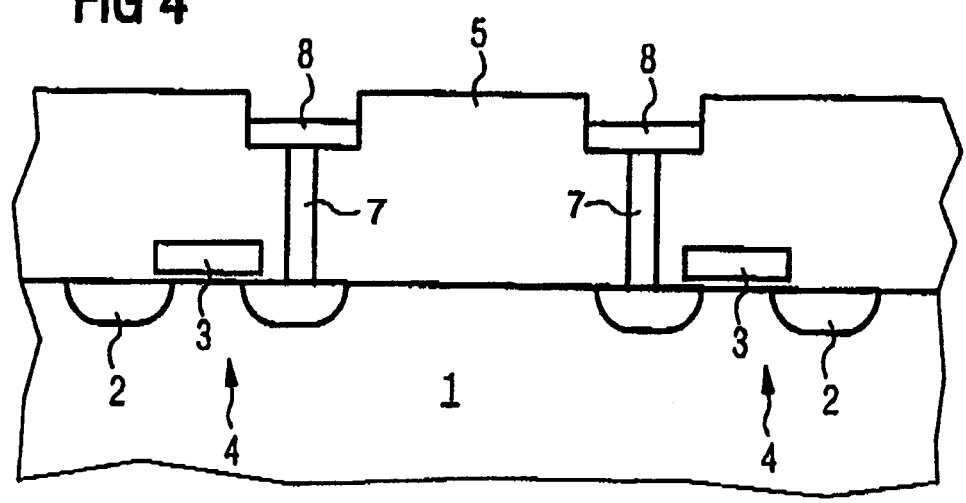

Subsequently, depressions are formed in the insulating layer 5 in a fashion overlapping the contact holes 6. These depressions are now filled with barrier material 8, for example iridium oxide, up to a prescribed depth. This is performed by depositing the barrier material 8 over the entire surface and subsequently carrying out anisotropic etching. The anisotropic etching is carried out until the prescribed depth is achieved in the depressions. The structure produced thereby is shown in FIG. 4.

This concludes the first step a) of the method according to the invention. A prestructured substrate has been provided to which the precious metal and/or the donor material can now subsequently be applied.

Figure 5:
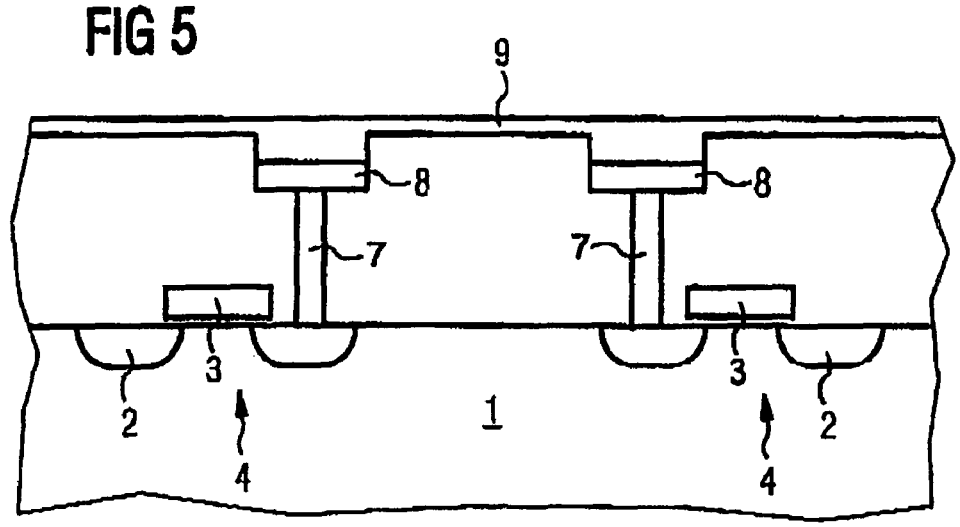
Figure 6:
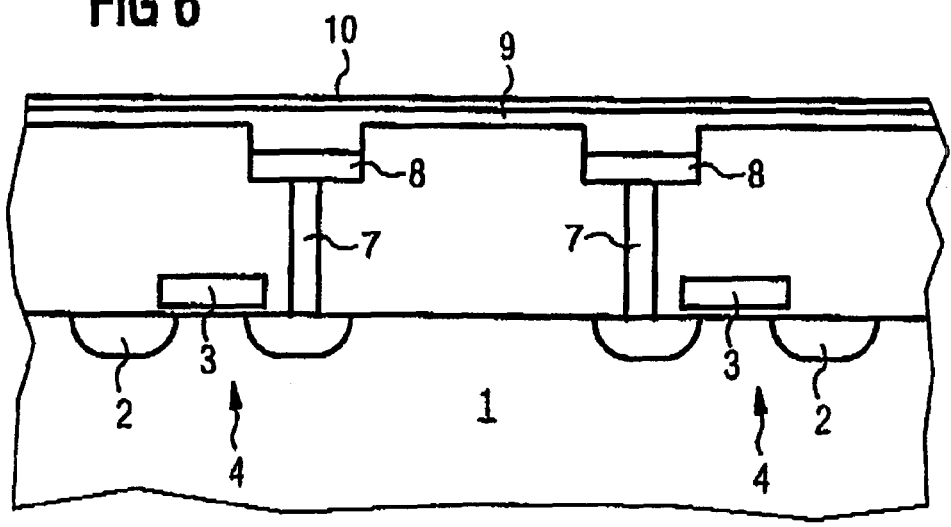

In this embodiment of the present invention, a precious metal, for example platinum is subsequently deposited over the entire surface of the structure shown in FIG. 4. The precious metal layer 9 is applied by a sputtering method at a temperature of approximately 500° C. The structure resulting therefrom is shown in FIG. 5. Subsequently, a titanium layer 10 is produced as donor material on the precious metal layer 9. This can be performed, for example, by a sputtering method. The structure resulting therefrom is shown in FIG. 6.

Heat treatment (annealing) then follows at a temperature of approximately 700° C. such that the titanium of the titanium layer 10 diffuses as additive into the platinum layer 9, producing an alloy layer 11. The thickness of the titanium layer 10 is selected such that the titanium diffuses completely into the platinum layer 9 with the result that essentially no titanium remains behind on the surface of the alloy layer 11. The structure resulting therefrom is shown in FIG. 7.

A CMP step is subsequently carried out, the alloy layer 11 being removed from the surface of the substrate. Only the portions of the alloy layer 11 located in the depressions above the barriers 8 remain behind. These parts of the alloy layer 11 later form the lower electrodes 12 for the still to be produced capacitors of the memory cells. A slurry with 1 to 5% by weight of abrasive $Al_2O_3$ particles and 2 to 10% by weight of $H_2O_2$ is used, for example, as oxidant for the CMP step. The use of a conventional slurry is possible, since the properties of the alloy layer are altered by the titanium which has diffused in such that chemical mechanical removal can be achieved even with conventional slurries.

After the CMP step, the insulating layer 5 is etched back by anisotropic etching so that the electrodes 12 protrude somewhat from the surface of the insulating layer 5. This appreciably increases the capacitor area of the storage capacitor still to be produced. A ferroelectric layer is then produced. An SBT film 13 is deposited with the aid of a CVD process onto the substrate thus prepared. The CVD process is carried out at a substrate temperature of 385° C. and a chamber pressure of approximately 1200 Pa. The oxygen fraction in the gas mixture is 60%. In this way, the SBT film 13 is deposited as an amorphous film. Consequently, the SBT film 13 essentially does not yet exhibit ferroelectric properties. The deposited, amorphous SBT 13 is subsequently annealed at a temperature of between 600 and 750° C. for 10 to 30 minutes in an oxygen atmosphere, the ferroelectric properties of the SBT 13 being produced.

The upper electrode of the storage capacitors is subsequently deposited over the entire surface. Again, because of their good oxidation resistance and/or the formation of electrically conductive oxides, 4*d* and 5*d* transition metals, in particular platinum metals (Ru, Rh, Pd, Os, Ir, Pt) and especially platinum itself are used as electrode material. The precious metal layer 14, for example platinum, is applied, for example, by a sputtering method with a sputtering temperature of approximately 300 to 550° C. After the application of the upper electrode, annealing is carried out again in order to heal the boundary layer between the ferroelectric layer 13 and the upper electrode 14. The precious metal layer 14 and the ferroelectric layer 13 are subsequently structured with the aid of an anisotropic etching method so as to produce the structure shown in FIG. 8.

The memory cells are thereby essentially completed. Further steps follow for the purpose of insulating the individual memory cells and of producing the wiring of the memory device. The methods used in this case belong, however, to the prior art and will not be explained here in more detail.

FIGS. 9 to 12 show a further method for producing a structured layer according to a second exemplary embodiment of the invention. The first step a) of the method in accordance with the second embodiment of the present invention corresponds in this case to what was explained in connection with FIGS. 1 to 4, and so repetition can be dispensed with.

Also in this embodiment of the present invention, a precious metal, for example platinum, is deposited over the entire surface of the structure shown in FIG. 4. The precious metal layer 9 is applied by a sputtering method at a temperature of approximately 500° C. The structure resulting therefrom is shown in FIG. 9. A titanium oxide layer 15 is subsequently produced as donor material on the precious metal layer 9. This can be performed, for example, by a CVD method. The structure resulting therefrom is shown in FIG. 10.

Figure 11:
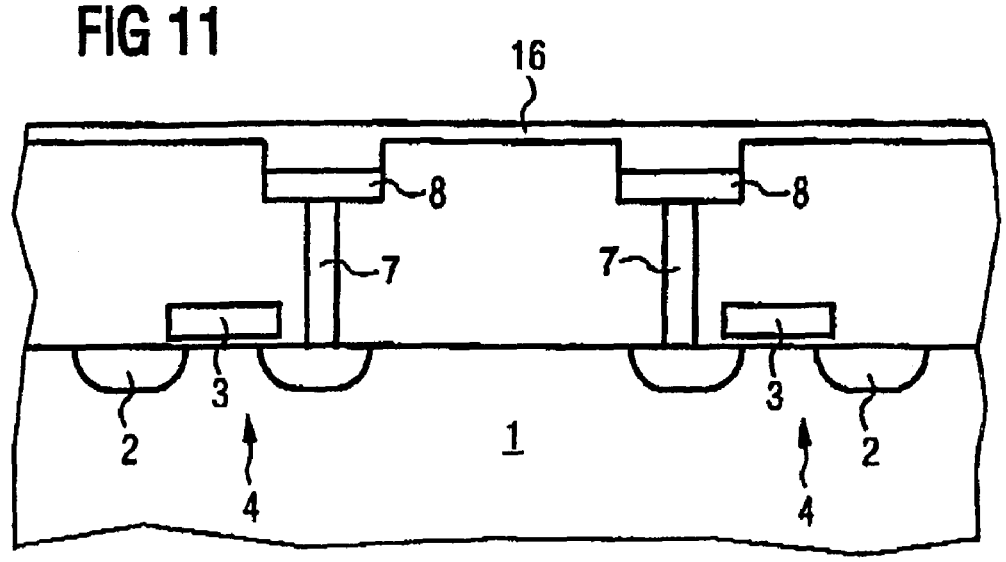

Heat treatment (annealing) follows at a temperature of approximately 700° C. in an oxygen atmosphere, such that the titanium of the titanium oxide layer 15 diffuses as additive into the platinum layer 9 and an alloy layer 16 is produced. A portion of the titanium also diffuses along the grain boundaries within the platinum layer 9. The titanium is oxidized by the oxygen of the oxygen atmosphere on the path along the grain boundaries, and so titanium oxide is also present along the grain boundaries. The heat treatment leaves a titanium oxide layer with a different stoichiometric composition on the alloy layer. This titanium oxide layer is removed from the alloy layer 16 by means of an additional etching step, for example with HF or HCL. The structure resulting therefrom is shown in FIG. 11.

A CMP step is subsequently carried out again, the alloy layer 16 being removed from the surface of the substrate. Only the parts of the alloy layer 16 which are disposed in the depressions above the barriers 8 remain behind. These parts of the alloy layer 16 later form the lower electrodes 12 for the still to be produced capacitors of the memory cells. A slurry with 1 to 5% by weight of abrasive $Al_2O_3$ particles and 2 to 10% by weight of $H_2O_2$ is used, for example, as oxidant for the CMP step. The use of a conventional slurry is possible, since the properties of the alloy layer are altered by the titanium which has diffused in such that chemical mechanical removal can be achieved even with conventional slurries.

Figure 12:
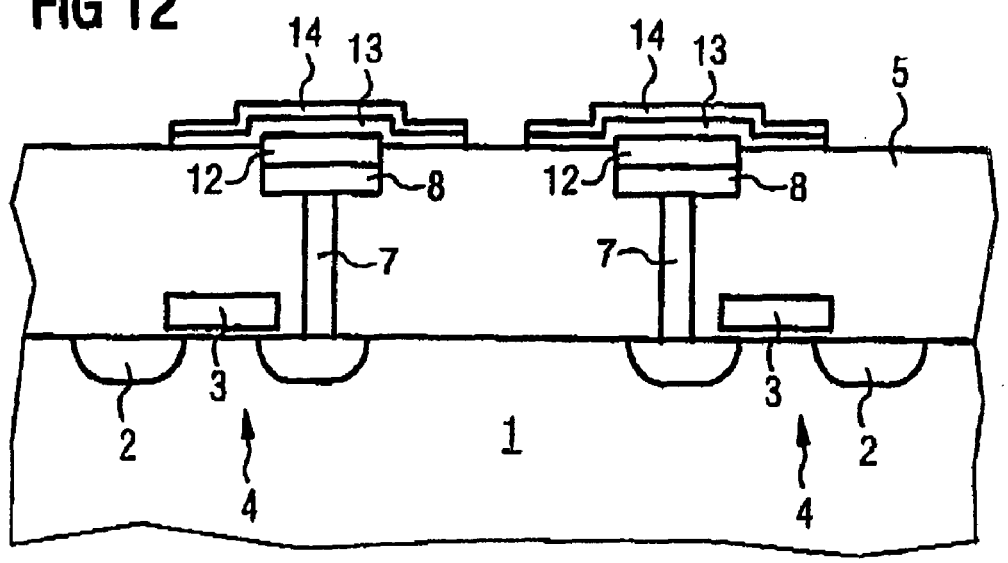

This is followed again by etching back of the insulating layer 5, the application and annealing of the ferroelectric layer 13 and the application of the upper electrode 14 and the structuring of the upper electrode 14 and of the ferroelectric layer 13, resulting in the situation shown in FIG. 12.

FIGS. 13 to 18 show a further method for producing a structured layer according to a third exemplary embodiment of the invention. The first steps of the method correspond in this case to what was explained in connection with FIGS. 1 to 2, and so repetition can be dispensed with.

Figure 13:
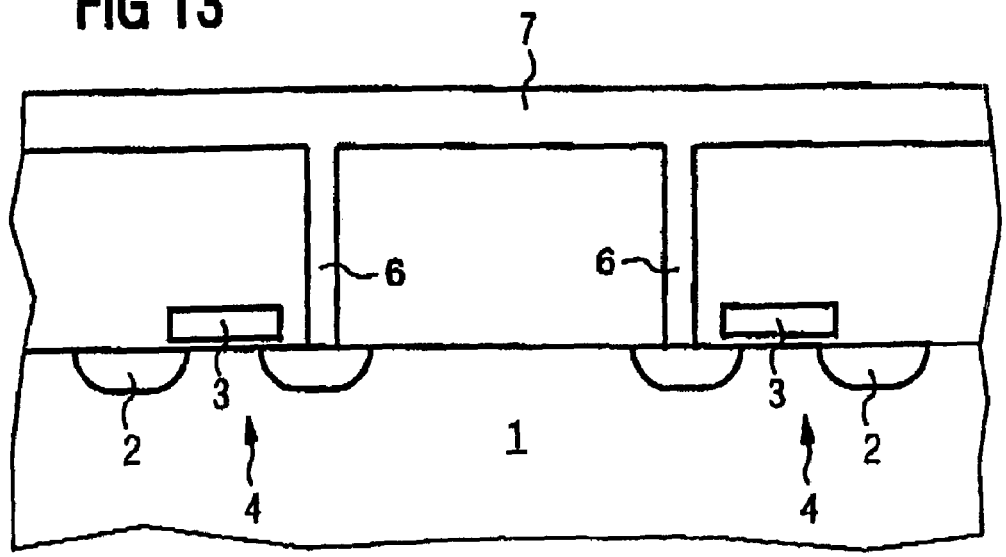
Figure 14:
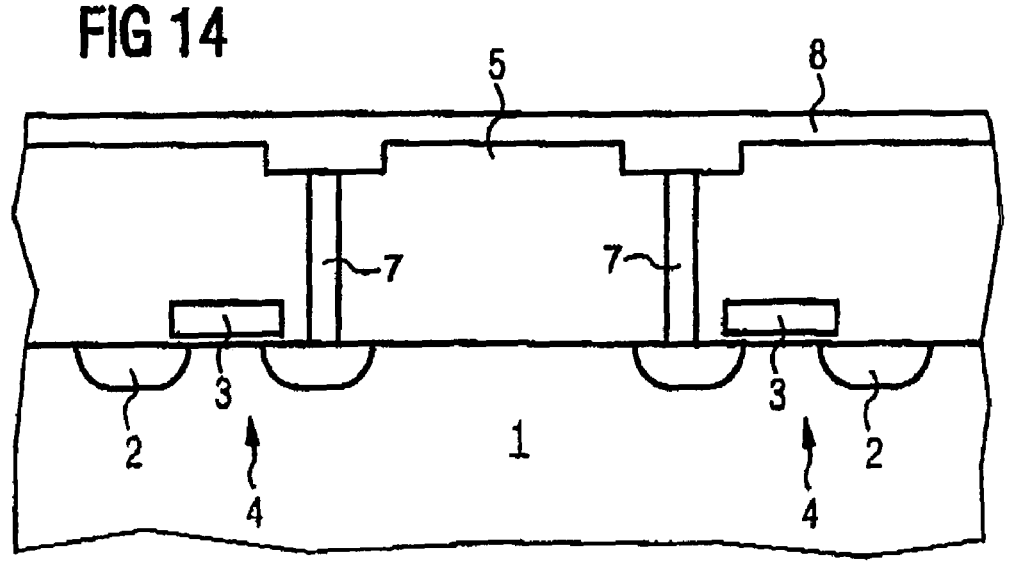

Conductive material 7, for example polysilicon doped in situ, is now applied to the structure. This can be performed, for example, by a CVD method. The contact holes 6 are completely filled up by the application of the conductive material 7, and a continuous conductive layer is produced on the insulating layer 5 (FIG. 13). This is followed by a CMP step (Chemical Mechanical Polishing) which removes the continuous conductive layer on the surface of the insulating layer 5 and produces a flat surface.

Figure 15:
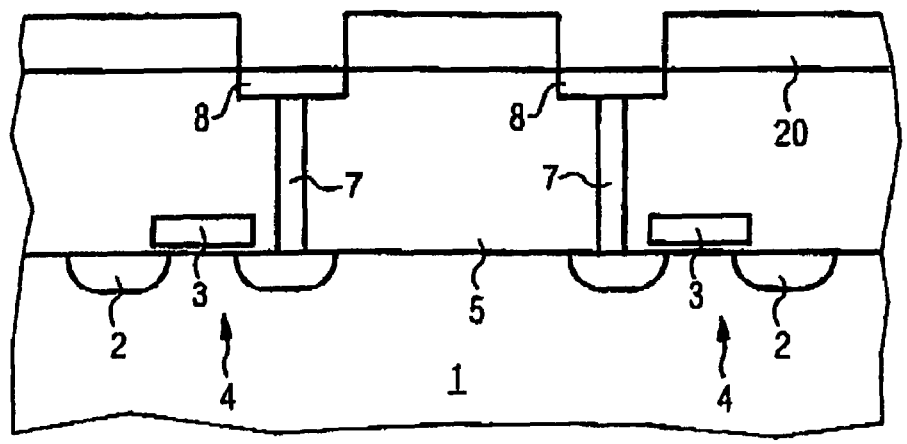

Depressions in the insulating layer 5 are subsequently formed in a fashion overlapping the contact holes 6. These depressions are now filled down to a prescribed depth with barrier material 8, for example iridium oxide. This is performed by depositing the barrier material 8 over the entire surface (FIG. 14) and subsequently carrying out a CMP step. Subsequently, a further insulating layer 20, for example $SiO_2$, is deposited which is structured in accordance with the electrodes 12 still to be produced. The structure resulting therefrom is shown in FIG. 15.

This concludes the first step a) of the method according to the invention. A prestructured substrate has been produced on which it is now possible subsequently to apply the precious metal and/or the donor material.

Figure 16:
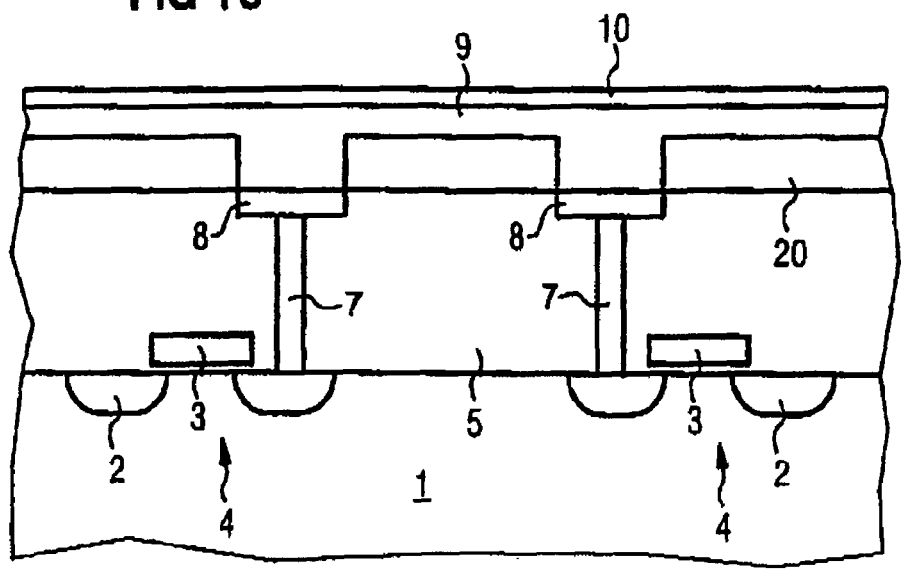

In this embodiment of the present invention, a precious metal, for example platinum is subsequently deposited over the entire surface of the structure shown in FIG. 15. The precious metal layer 9 is applied by a sputtering method at a temperature of approximately 500° C. Subsequently, a titanium layer 10 is produced as donor material on the precious metal layer 9. This can be performed, for example, by a sputtering method. The structure resulting therefrom is shown in FIG. 16.

Heat treatment (annealing) then follows at a temperature of approximately 700° C. such that the titanium of the titanium layer 10 diffuses as additive into the platinum layer 9, producing an alloy layer. The thickness of the titanium layer is selected such that the titanium diffuses completely into the platinum layer 9, with the result that essentially no titanium remains behind on the surface of the alloy layer.

A CMP step is subsequently carried out, the alloy layer being removed from the surface of the substrate. Only the portions of the alloy layer which are disposed in the depressions in the insulating layer 20 above the barriers 8 remain behind. These parts of the alloy layer later form the lower electrodes 12 for the still to be produced capacitors of the memory cells. A slurry with 1 to 5% by weight of abrasive $Al_2O_3$ particles and 2 to 10% by weight of $H_2O_2$ is used, for example, as oxidant for the CMP step. The use of a conventional slurry is possible, since the properties of the alloy layer are altered by the titanium which has diffused in such that chemical mechanical removal can be achieved even with conventional slurries.

After the CMP step, the insulating layer 20 is etched back by anisotropic etching so that the electrodes 12 protrudes somewhat from the surface of the insulating layer 20. This subsequently increases the capacitor area of the storage capacitor still to be produced. This is followed again by the application and annealing of the ferroelectric layer 13 and the application of the upper electrode 14 and the structuring of the upper electrode 14 and of the ferroelectric layer 13, resulting in the situation shown in FIG. 12.

We claim:

1. A method of producing a structured layer, which comprises the following steps:

providing a prestructured substrate;

applying to the prestructured substrate a precious metal and a donor material containing an additive which is not a precious metal in two or more layers;

subjecting the layers to heat treatment at a temperature of between approximately 400° C. and approximately 800° C., such that the additive diffuses into the precious metal and an alloy layer is produced; and polishing the alloy layer by chemical and mechanical means.

2. The method according to claim 1, wherein the donor material essentially comprises only the additive.

3. The method according to claim 1, which comprises applying the donor material to the substrate before the precious metal.

4. The method according to claim 3, which comprises alternately applying several layers of the donor material and at least one layer of the precious metal, starting with a layer of the donor material.

5. The method according to claim 1, wherein the precious metal is applied to the substrate before the donor material.

6. The method according to claim 1, wherein several layers of the precious metal and at least one layer of the donor material are applied alternately, starting with a layer of the precious metal.

7. The method according to claim 1, wherein the thickness of the donor material is selected such that during heat treatment the donor material essentially diffuses completely into the precious metal.

8. The method according to claim 1, wherein the precious metal is an element from Group 8b of the Periodic Table of the Elements and/or is Au.

9. The method according to claim 8, wherein the precious metal is from Group 8b of the Periodic Table of the Elements and/or is Ir.

10. The method according to claim 1, wherein the additive is Ti, $TiO_x$, Ta, W, Bi, Ru and/or Pd.

11. The method according to claim 1, wherein the donor material is Ti, $TiO_x$, TiN, Ta, TaN, W, WN, Bi, $BiO_x$, $IrO_x$, $IrHfO_x$, $RuO_x$ and/or $PdO_x$.

12. The method according to claim 1, wherein the alloy layer produced contains between approximately 5 and approximately 30 atom % of the donor material.

13. The method according to claim 1, wherein a slurry containing water, abrasive particles and at least one oxidant is used for the chemical mechanical polishing.

14. The method according to claim 13, wherein $Al_2O_3$ particles or $SiO_2$ particles are used as abrasive particles.

15. The method according to claim 13, wherein the abrasive particles have a size of approximately 50 to 300 nm.

16. The method according to claim 13, wherein $H_2O_2$ is used as the at least one oxidant.

17. The method according to claim 13, wherein the slurry has at least one stabilizer.

18. The method according to claim 17, wherein the stabilizer is polyacrylic acid.

* * * * *